US012791586B2

(12) United States Patent
Jodka et al.

(10) Patent No.: US 12,791,586 B2
(45) Date of Patent: Nov. 10, 2026

(54) CURRENT SENSING CIRCUIT AND METHOD FOR SENSING A CURRENT

(71) Applicant: Renesas Design (UK) Limited, Bourne End (GB)

(72) Inventors: Eduardas Jodka, Freiburg (DE); Stefan Dietrich, Uebach-Palenberg (DE)

(73) Assignee: RENESAS DESIGN (UK) LIMITED, Bourne End (GB)

(*) Notice: Subject to any disclaimer, the term of this patent is extended or adjusted under 35 U.S.C. 154(b) by 180 days.

(21) Appl. No.: 18/678,639

(22) Filed: May 30, 2024

(65) Prior Publication Data

US 2025/0370009 A1 Dec. 4, 2025

(51) Int. Cl.

| | |
|---|---|
| ***G01R 15/14*** | (2006.01) |
| ***G01R 1/20*** | (2006.01) |
| ***H02M 1/00*** | (2006.01) |
| ***H02M 3/158*** | (2006.01) |

(52) U.S. Cl.

CPC ........... *G01R 15/146* (2013.01); *G01R 1/203* (2013.01); *H02M 1/0009* (2021.05); *H02M 3/158* (2013.01)

(58) Field of Classification Search

CPC ..................................................... G01R 31/08

See application file for complete search history.

(56) References Cited

U.S. PATENT DOCUMENTS

2005/0184721 A1* 8/2005 Peterson ............. H03F 3/45273 324/117 R

2008/0198526 A1* 8/2008 Hiyama ............. H03K 17/0828 361/93.7

* cited by examiner

*Primary Examiner* — Tung X Nguyen

(74) *Attorney, Agent, or Firm* — SCULLY, SCOTT, MURPHY & PRESSER, P.C.

(57) ABSTRACT

A current sensing circuit configured to sense a current through a power switch is provided. The current sensing circuit includes a comparator having a first terminal and a second terminal. Furthermore, the current sensing circuit includes a first sensing branch configured to couple a first node of the power switch with the first terminal of the comparator via a first reference resistor, and a second sensing branch configured to couple a second node of the power switch with the second terminal of the comparator via a second reference resistor. The current sensing circuit further includes an offset unit configured to generate a reference current on the first sensing branch, such that the reference current is proportional to a replica voltage across a replica device of the power switch.

20 Claims, 8 Drawing Sheets

CURRENT SENSING CIRCUIT AND METHOD FOR SENSING A CURRENT

TECHNICAL FIELD

The present document relates to sensing of the current through a power switch.

BACKGROUND

A switched-mode DC/DC power converter may achieve output voltage regulation by duty-cycling the power stage of the power converter in a controlled manner. Different modes of operation may be used such as continuous-conduction mode (CCM) or discontinuous-conduction mode (DCM), the latter being used to provide a relatively high voltage conversion efficiency at relatively light and/or medium load currents.

The different modes of operation of a power converter may involve the need to detect one or more pre-determined target values of the current through a power switch of the power converter, such as a pre-determined peak current and/or a pre-determined valley current.

The present document addresses the technical problem of performing current level detection in an efficient and precise manner. The technical problem is solved by each one of the independent claims. Preferred examples are described in the dependent claims.

SUMMARY

According to an aspect, a current sensing circuit configured to sense a current through a power switch (e.g. a transistor such as FET) is described. The current sensing circuit includes a comparator having a first terminal and a second terminal. Furthermore, the current sensing circuit includes a first sensing branch configured to couple a first node of the power switch with the first terminal of the comparator via a first reference resistor, and The current sensing circuit further includes an offset unit configured to generate a reference current on the first sensing branch, such that the reference current is proportional to a replica voltage across a replica device of the power switch. The current sensing circuit may further include a second sensing branch configured to couple a second node of the power switch with the second terminal of the comparator via a second reference resistor.

According to another aspect, a method for sensing a current through a power switch is described. The method includes coupling a first node of the power switch with a first terminal of a comparator via a first sensing branch with a first reference resistor, and coupling a second node of the power switch with a second terminal of the comparator via a second sensing branch with a second reference resistor. Furthermore, the method includes generating a reference current on the first sensing branch, such that the reference current is proportional to a replica voltage across a replica device of the power switch.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

BRIEF DESCRIPTION OF THE FIGURES

The embodiments of the disclosure are explained below in an exemplary manner with reference to the accompanying drawings, wherein.

DETAILED DESCRIPTION

Figure 1A:
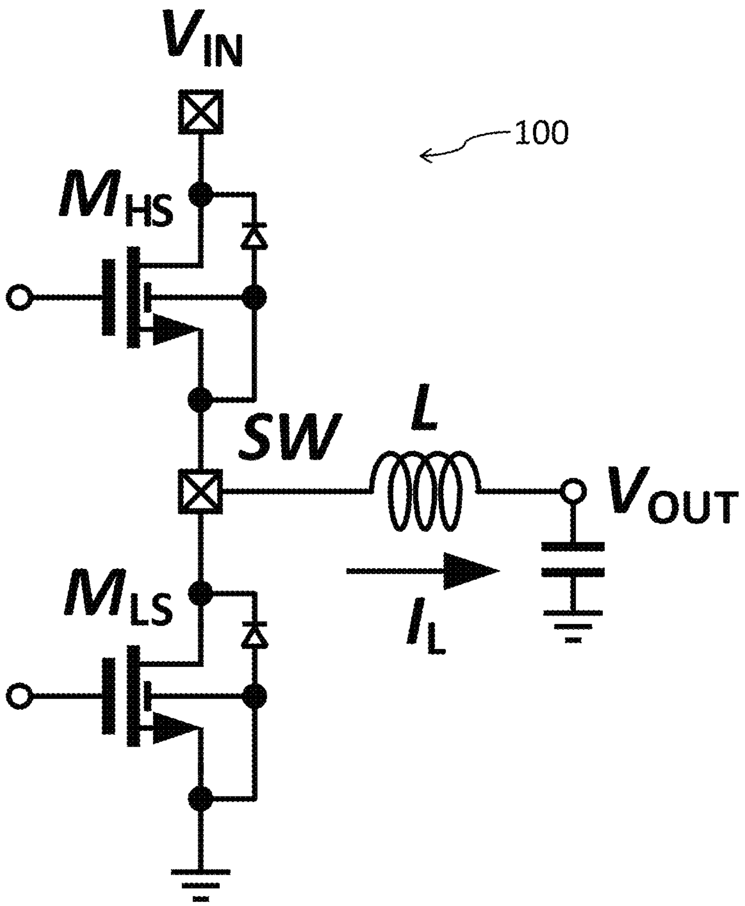
FIG. 1A illustrates an example power converter.

As indicated above, the present document relates to the efficient and precise detection of the current through a power switch (notably a power transistor such as a FET) of a power converter reaching a pre-determined target value. In this context, FIG. 1A shows an example DC/DC power converter, notably a buck converter, which is configured to provide an output voltage $V_{OUT}$ in dependence of an input voltage $V_{IN}$, using a high-side (power) switch $M_{HS}$ and a low-switch (power) switch $M_{LS}$, which are coupled to one another at an intermediate (switched) node SW, wherein the switched node SW is coupled to the output of the converter 100 via an inductor L. The inductor current $I_L$ through the inductor L is provided to the output of the converter 100.

Figure 1B:
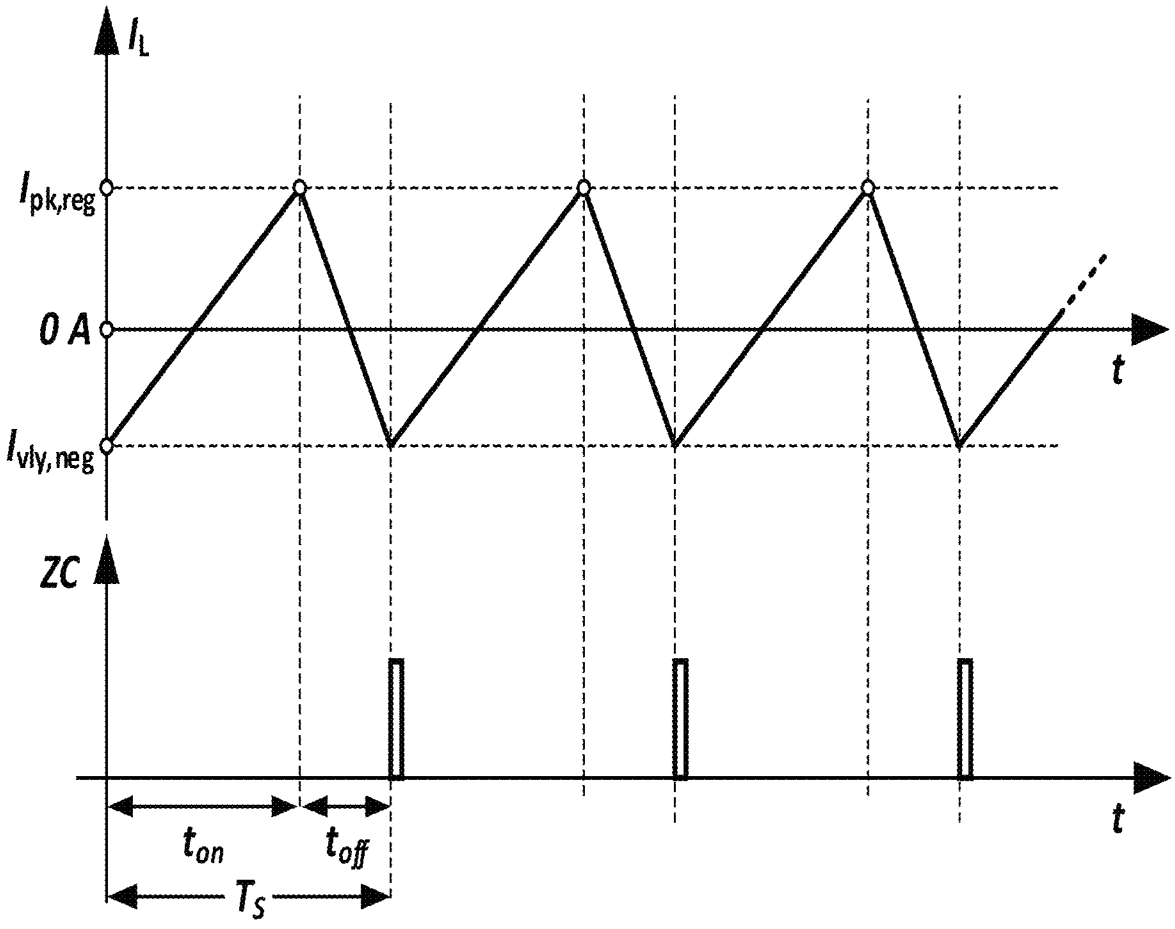
FIG. 1B shows the inductor current during operation of a power converter.

When regulating the output voltage to a pre-determined level using CCM, the inductor current may be varied between a (negative) valley current $I_{vly,neg}$ and a (positive) peak current $I_{pk,reg}$, as illustrated in FIG. 1B. The inductor current $I_L$ switching period $T_S$ comprises an on-time ($t_{on}$), where the inductor is magnetized, and an off-time ($t_{off}$), where the inductor is de-magnetized. The transition from $t_{on}$ to $t_{off}$ is triggered when the regulated peak current $I_{pk,reg}$ is reached, whereas transition from $t_{off}$ to $t_{on}$ occurs when the minimum allowed inductor valley current $I_{vly,neg}$ is detected. The valley current detection event is illustrated in FIG. 1B by a digital signal denoted as 'ZC' (zero current). Hence, the off-time (de-magnetization) ends with an inductor current detection event. Inductor current detection may be performed using a current comparator, as illustrated in FIG. 1C.

Figure 1C:
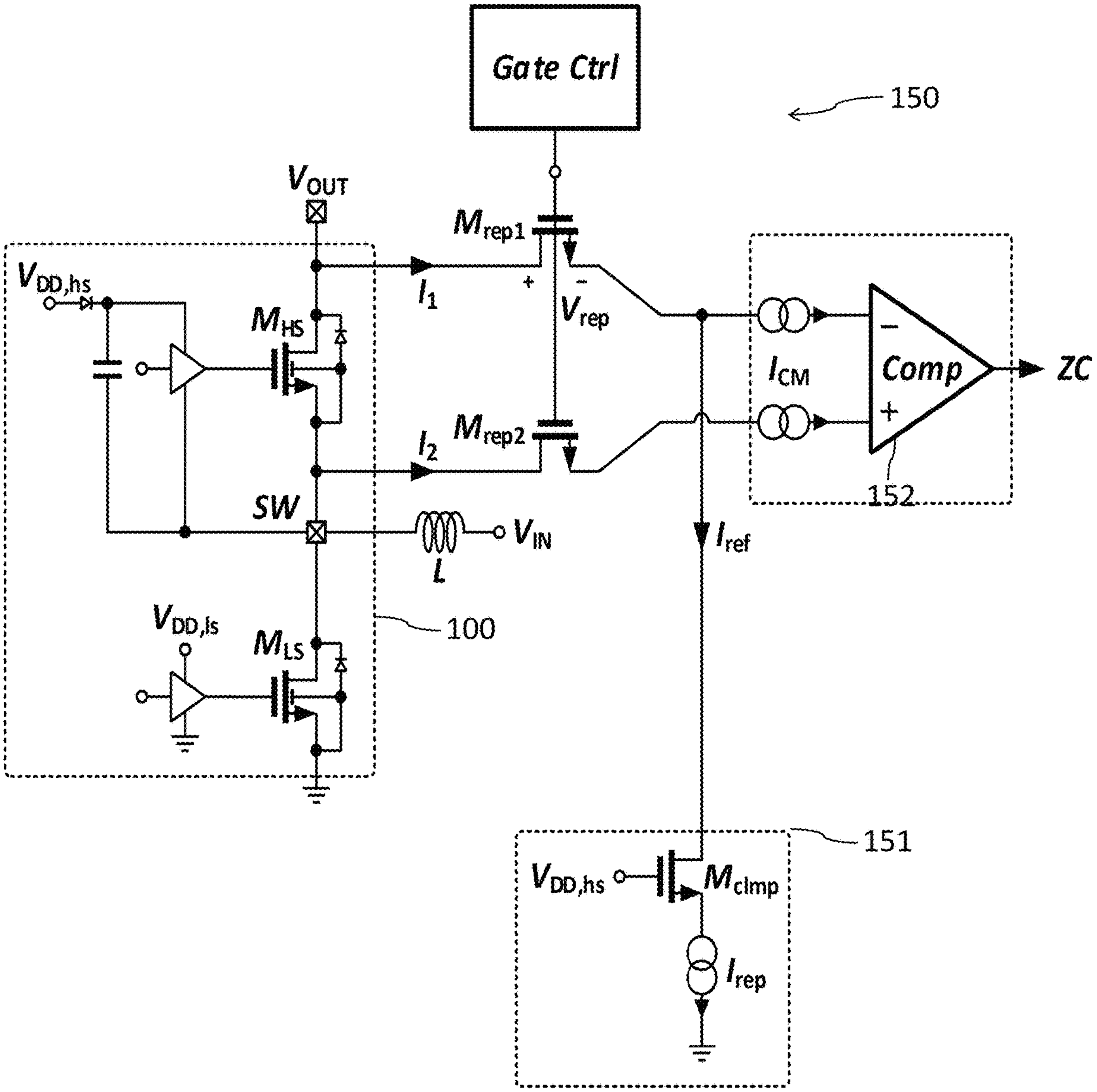
FIG. 1C shows an example current sensing circuit.

FIG. 1C shows an example DC/DC converter 100, in particular a boost converter. The power stage comprises a low-side power switch ($M_{LS}$) and a high-side power switch ($M_{HS}$). A NMOS type high-side switch may be used due to its relatively high switching efficiency. A bootstrapped gate-driver may be used to control the NMOS type high-side switch (as shown in FIG. 1C). During off-time (de-magnetization), the inductor current may be sensed based on the voltage across the high-side switch, since the high-side switch is conducting during the off-time (of the boost converter).

FIG. 1C shows a current sensing circuit 150 which comprises a comparator 152 for performing zero current detection. A common gate (CG)-stage topology may be used for current sensing, due to its suitable large-signal biasing point. As a result of this, the comparator 152 draws symmetrical common-mode biasing currents $I_{CM}$ from the output node and from the SW-node of the power converter 100 (wherein the output node corresponds to a first node and the SW-node corresponds to a second node of the high-side switch).

The inductor current which flows through the high-side switch creates a certain voltage drop across the high-side switch, wherein the voltage drop is proportional to the on-resistance value of the high-side switch. When the inductor current reaches zero, both input terminals of the comparator 151 become equal in terms of their potential, and by consequence, the comparator 151 triggers, flagging the zero current event.

The detection of the negative and/or valley inductor current in CCM may also be performed by sensing the current across the high-side switch. For this purpose, an offset is applied to the sensing comparator 151, wherein the offset is indicative of the negative and/or valley inductor current (i.e. of the target value of the current).

FIG. 1C includes a replica device $M_{rep}$ in both sensing branches of the comparator 152 to account for the fact that there are common-mode biasing currents $I_{CM}$ flowing, given that the comparator 152 is in a CG-stage topology. Furthermore, a reference current $I_{ref}$ is applied to one of the branches using an offset unit 151. This current, acting on just one branch, creates an additional voltage drop $V_{rep}$ across one replica device $M_{rep1}$, which results in a comparator offset. The replica devices in the two sensing branches are used to match with the high-side switch, in order to achieve an increased accuracy over PVT (process, voltage, temperature). Gate control circuitry is used for controlling the switching behavior of the replica devices.

The biasing currents which flow through each replica device are:

for the replica device $M_{rep1}$: $I_1=I_{CM}+I_{ref}$ for the replica device $M_{rep2}$: $I_2=I_{CM}$ As can be seen from FIG. 1C, for providing an accurate high-side comparator offset, two replica devices may be used, which require additional gate control circuitry for controlling the switching behaviour. Replica devices may take up a relatively large die area, since a relatively large ratio is needed with respect to the high-side power switch (e.g. a FET) itself, in order to ensure a relatively low power consumption caused by the reference current $I_{ref}$. In the present document, a modular and area-efficient current sensing circuit 150 is described which allows the introduction of an accurate offset to the comparator 151 that senses the current across a power switch.

Figure 2A:
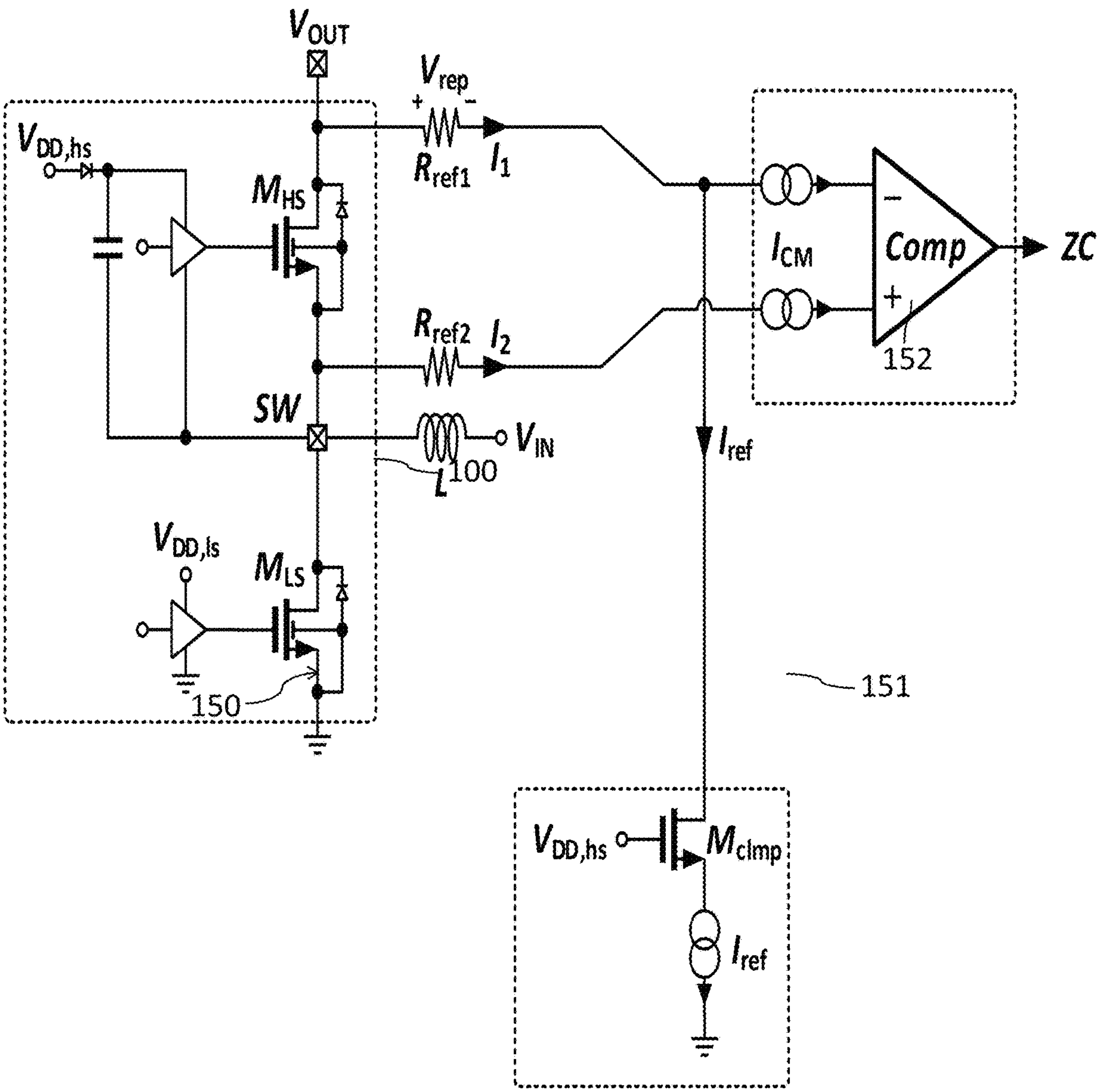
FIG. 2A shows a current sensing circuit including reference resistors.

FIG. 2A shows an example current sensing circuit 150 which comprises two reference resistors $R_{ref1}$ and $R_{ref2}$ on the two sensing branches of the comparator 152. The use of reference resistors simplifies the design, due to the fact that no switching control circuitry is required. Furthermore, resistor sizing may be adjusted such as to neither impact the speed of sensing nor the mismatch of the overall sensing structure. Additionally, increasing the nominal resistance value of $R_{ref1}$ and $R_{ref2}$ may be used to filter out switching noise coming from the power stage and/or to reduce the reference current $I_{ref}$ which is used for generating the offset for sensing the target value of the current through the power stage. Hence, the use of reference resistors enables a low-power design.

As shown in FIG. 2A, the comparator offset may be provided by introducing a reference current $I_{ref}$ to one of the sensing branches. The reference current creates a voltage drop across the reference resistor $R_{ref1}$ resulting in a comparator offset. The accuracy of the comparator offset may be achieved by ensuring that the reference current $I_{ref}$ behavior (with regards to PVT) is proportional to the behavior of the power switch (i.e., of the high-side switch) itself. The clamping device $M_{clmp}$ may be used optionally for a transition between power domains.

Figure 2B:
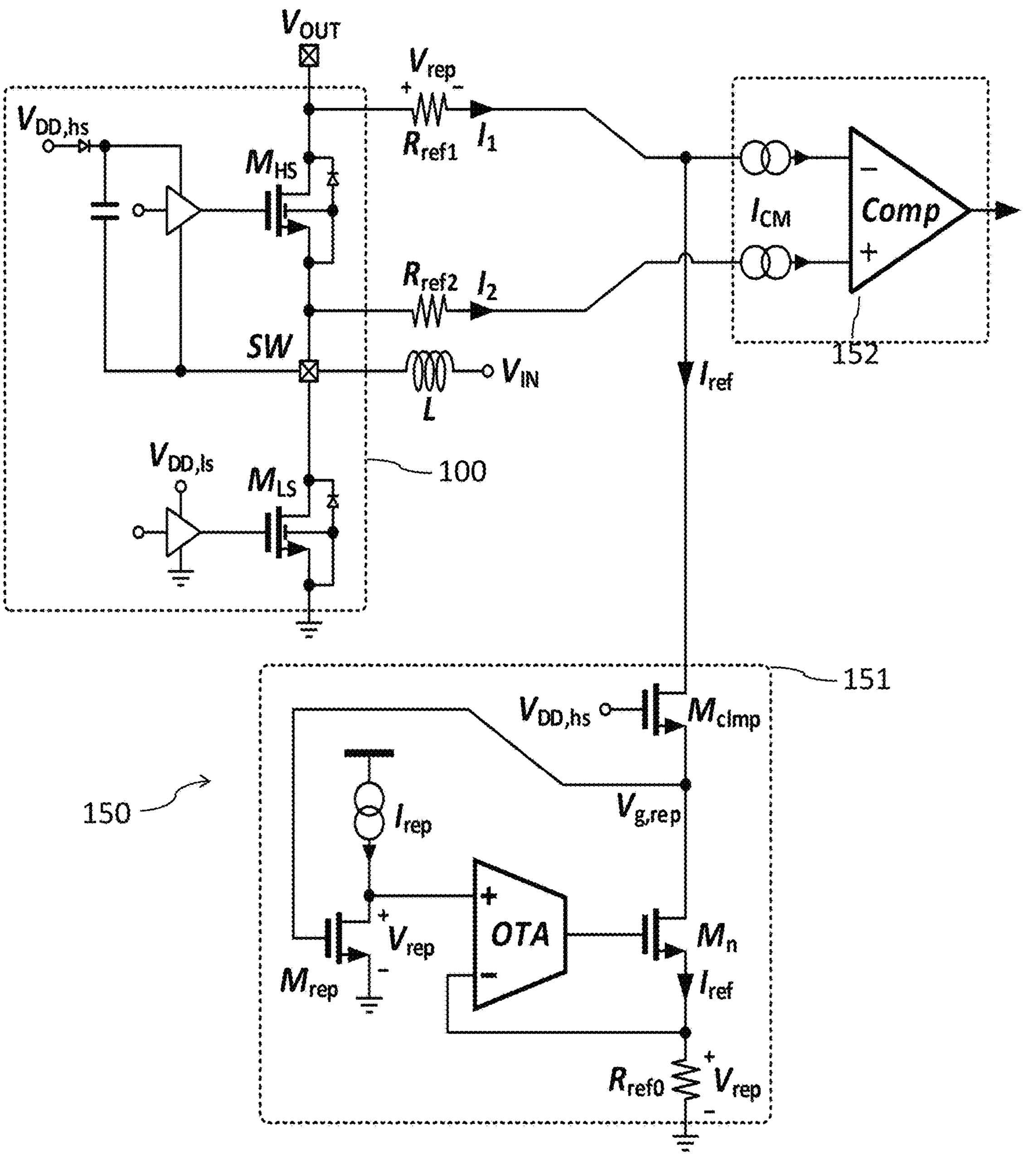
FIG. 2B shows a current sensing circuit including a reference resistor for offset generation.

FIG. 2B shows an example offset unit 151 which is configured to provide a reference current having a (PVT) behavior that is proportional to the (PVT) behavior of the power switch. A single replica device $M_{rep}$ may be used within the offset unit 151, wherein the current through the replica device is set to a certain replica current $I_{rep}$. The replica current corresponds to the target value of the current through the power switch, scaled by the sizing ratio between the power switch Mus and the replica device $M_{rep}$. It should be noted that the replica device $M_{rep}$ operates in a relatively low-noise, non-switching and low-voltage environment, such that no timing-critical control circuitry is required for driving the replica device.

The replica current $I_{rep}$ flowing through the replica device $M_{rep}$ results in a replica voltage drop $V_{rep}$ at the replica device, wherein the replica voltage may be sensed by an operational transconductance amplifier (OTA). The OTA, due to its relatively high gain, accurately translates the sensed replica voltage to a corresponding voltage drop across the offset resistor $R_{ref0}$ (as shown in FIG. 2B). The transistor $M_n$ acts as a regulation device for the OTA to equalize the voltage between the two input terminals of the OTA. It should be noted that all the voltage references are created in a static environment such that the bandwidth and/or power requirements for the circuit elements of the offset unit 151, such as the OTA, are relatively low, thereby providing a low power and high accuracy design.

The reference current through the transistor $M_n$ is set by the voltage drop $V_{rep}$ across the offset resistor $R_{ref0}$, namely $I_{ref}=V_{rep}/R_{ref0}$. Given that the voltage drop $V_{rep}$ is equal to the voltage drop across the replica transistor $M_{rep}$, the reference current $I_{ref}$ may be used for generating an accurate sensing comparator offset. As shown in FIG. 2B, the reference current is pulled through the reference resistor $R_{ref1}$, thereby creating an offset voltage $V_{rep}$.

The gate terminal of the replica device $M_{rep}$ preferably represents the gate-source voltage of the corresponding power switch $M_{HS}$, when the power switch $M_{HS}$ is turned on. Given that the high-side power switch $M_{HS}$ has a bootstrapped driver, and that the gate-source voltage is the result of charge re-distribution between the bootstrap capacitor and the gate capacitance of the high-side switch, it may be relatively difficult to re-create the gate-source voltage across the replica device in an accurate manner. In FIG. 2B, an approximation is provided by setting the gate terminal of the replica device $M_{rep}$ to be equal to the supply voltage $V_{DD,hs}$ minus the gate-source voltage of the clamping device $M_{clmp}$, namely, $V_{g,rep}=V_{DD,hs}-V_{gs,clmp}$. The supply voltage $V_{DD,hs}$ is also the voltage, to which the bootstrap capacitor is being recharged in the high-side driver. Subtraction of the gate-source voltage of the clamping device $M_{clmp}$ represents the charge loss by the high-side switch $M_{HS}$ during the charge-redistribution.

Figure 3A:
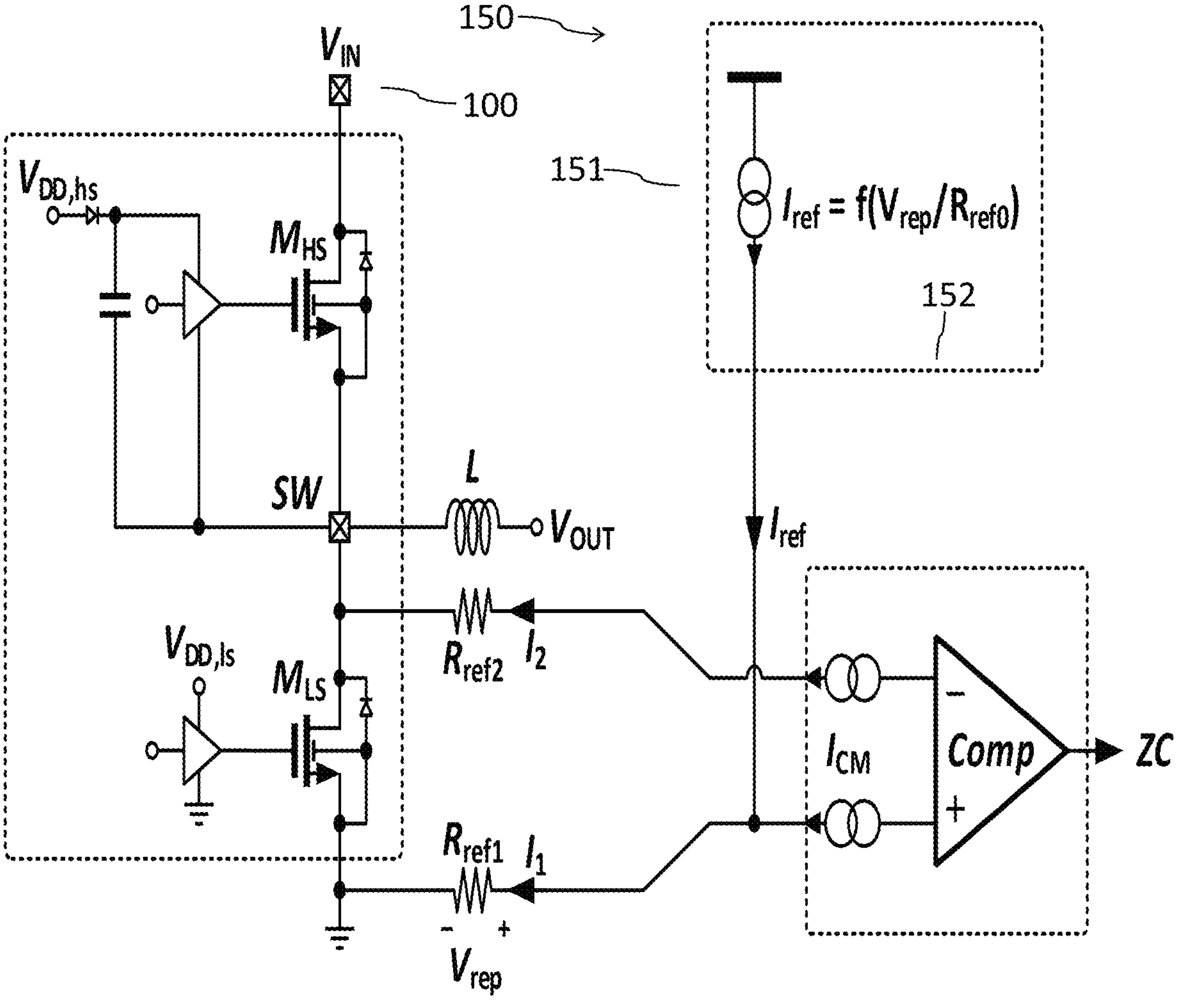
FIG. 3A and FIG. 3B illustrate different variants of a current sensing circuit.

As shown in FIG. 3A, the sensing circuit 150 of FIG. 2C, notably the offset unit 151, may be used in conjunction with a buck converter. In this case, the current sensing is implemented across the low-side switch. The offset is created by injecting a reference current, which is proportional to the replica voltage, into one of the sensing branches, thereby creating a voltage drop across the reference resistor $R_{ref1}$. The reference current $I_{ref}$ is generated by the offset unit 151 shown in FIG. 2B.

Figure 3B:
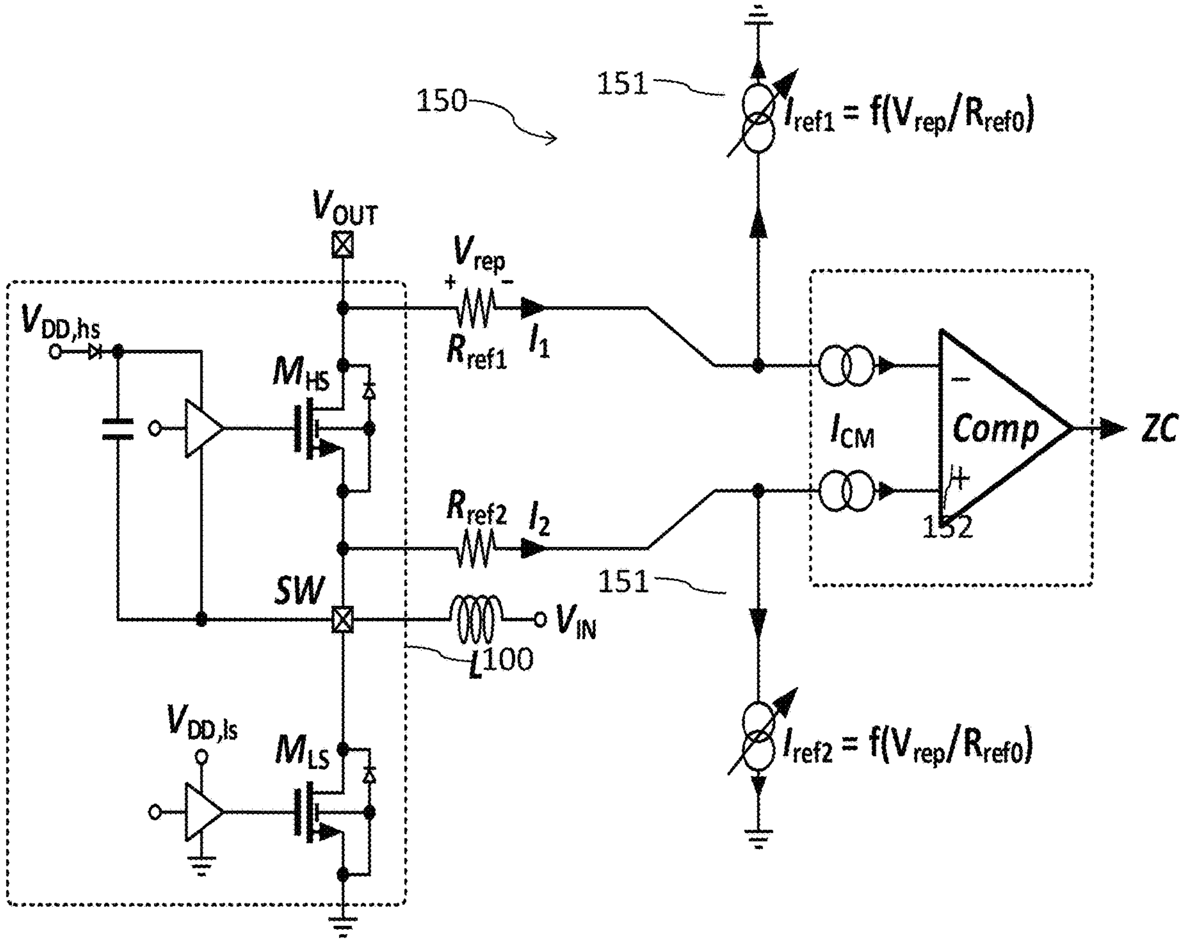

The circuity described herein may also be used for comparator accuracy trimming, as shown in FIG. 3B. In FIG. 3B, reference currents are introduced to both branches so that the offset is bi-directional. The reference currents $I_{ref1}$ and $I_{ref2}$ are generated using the offset units 151 shown in FIG. 2B. By generating a reference current which is proportional to the behavior of a replica device (as opposed to using a fixed trimming current) the post-trim accuracy over temperature may be improved.

Figure 4:
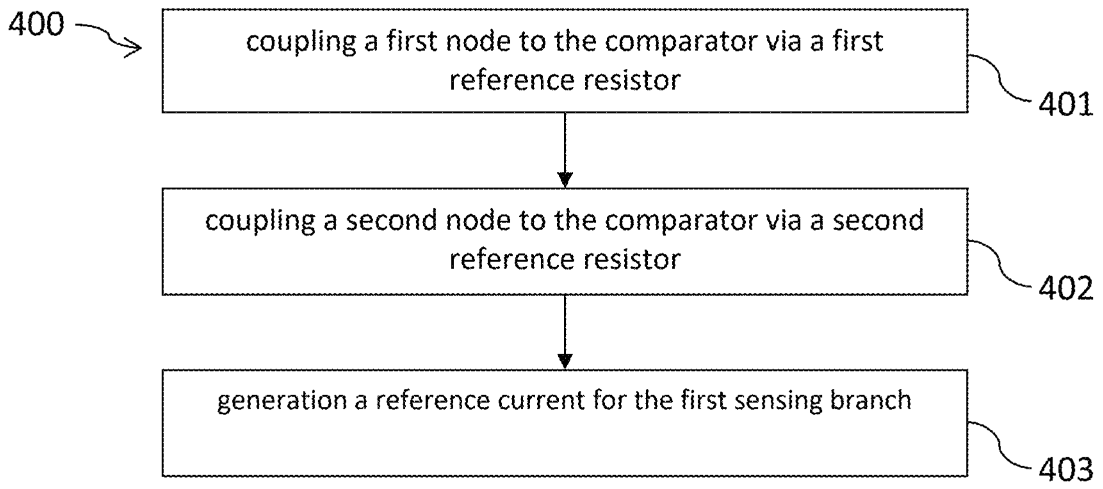
FIG. 4 shows a flow chart of an example method for sensing the current through a power switch.

FIG. 4 shows a flow chart of an example method 400 for sensing the current $I_L$ through a power switch $M_{HS}$, $M_{LS}$. The power switch $M_{HS}$, $M_{LS}$ may be part of a power converter 100. The method 400 may be directed at detecting whether or not the current $I_L$ through the power switch $M_{HS}$, $M_{LS}$ has reached a pre-determined target value (e.g. a peak current or a valley current). The power switch $M_{HS}$, $M_{LS}$ may be a transistor, notably a field effect transistor (FET).

The method 400 comprises coupling 401 a first node of the power switch $M_{HS}$, $M_{LS}$ (e.g. one of the source or the drain) with a first terminal (e.g. one of the positive or the negative terminal) of a comparator 152 via a first sensing branch with a first reference resistor $R_{ref1}$ (wherein the first reference resistor $R_{ref1}$ typically is a passive two-terminal electrical component).

Furthermore, the method 400 comprises coupling 402 a second node of the power switch $M_{HS}$, $M_{LS}$ (e.g. the respective other one of the source or the drain) with a second terminal (e.g. the respective other one of the positive or the negative terminal) of the comparator 152 via a second sensing branch with a second reference resistor $R_{ref2}$ (wherein the second reference resistor $R_{ref2}$ typically is a passive two-terminal electrical component).

The method 400 further comprises generating 403 a reference current $I_{ref}$ on the first sensing branch, such that the reference current $I_{ref}$ is proportional to a replica voltage $V_{rep}$ across a replica device $M_{rep}$ of the power switch $M_{HS}$, $M_{LS}$. The reference current $I_{ref}$ is typically generated in dependence of the target value for the current $I_L$ through the power switch $M_{HS}$, $M_{LS}$. Hence, the reference current $I_{ref}$ is generated using a replica device $M_{rep}$ of the power switch $M_{HS}$, $M_{LS}$. By doing this, a precise and efficient sensing of the current $I_L$ through the power switch $M_{HS}$, $M_{LS}$ may be achieved (using reference resistors).

Furthermore, a current sensing circuit 150 is described, wherein the current sensing circuit 150 is configured to sense the current $I_L$ through a power switch $M_{HS}$, $M_{LS}$.

The current sensing circuit 150 comprises a comparator 152 having a first terminal and a second terminal. Furthermore, the current sensing circuit 150 comprises a first sensing branch configured to couple a first node of the power switch $M_{HS}$, $M_{LS}$ with the first terminal of the comparator 152 via a first reference resistor $R_{ref1}$. In addition, the current sensing circuit 150 comprises a second sensing branch configured to couple a second node of the power switch $M_{HS}$, $M_{LS}$ with the second terminal of the comparator 152 via a second reference resistor $R_{ref2}$. The first reference resistor $R_{ref1}$ and the second reference resistor $R_{ref2}$ are preferably implemented as passive electrical components (with no control). The resistance values of the first reference resistor $R_{ref1}$ and of the second reference resistor $R_{ref2}$ may be substantially equal (e.g. they may deviate by less than 5%, preferably by less than 1%).

The first reference resistor $R_{ref1}$ and the second reference resistor $R_{ref2}$ typically each have a temperature dependency. Preferably the temperature dependencies of the first reference resistor $R_{ref1}$ and of the second reference resistor $R_{ref2}$ deviate by less than 10% or by less than 5% or by less than 2% from one another. By doing this, a particularly precise current sensing may be achieved.

The comparator 152 may be configured to draw symmetrical and/or identical common-mode biasing currents $I_{CM}$ on the first sensing branch and on the second sensing branch. Alternatively, or in addition, the comparator 152 may be configured to compare a first voltage at the first terminal with a second voltage at the second terminal. The comparator 152 may be triggered, when the first voltage and the second voltage become equal. The difference between the first voltage and the second voltage typically depends on the voltage drop across the power switch $M_{HS}$, $M_{LS}$. The voltage drop across the power switch $M_{HS}$, $M_{LS}$ typically depends on the current $I_L$ through the power switch $M_{HS}$, $M_{LS}$ (with the proportionality factor being the on-resistance of the power switch $M_{HS}$, $M_{LS}$). The on-resistance of the power switch $M_{HS}$, $M_{LS}$ is typically PVT dependent. Hence, the voltage drop across the power switch $M_{HS}$, $M_{LS}$ (for a given value of the current $I_L$ through the power switch $M_{HS}$, $M_{LS}$) may be PVT dependent.

The current sensing circuit 150 comprises an offset unit 151 which is configured to generate a reference current $I_{ref}$ on the first sensing branch, such that the reference current $I_{ref}$ is proportional to a replica voltage $V_{rep}$ across a replica device $M_{rep}$ of the power switch $M_{HS}$, $M_{LS}$. The replica device $M_{rep}$ may be a replica of the power switch $M_{HS}$, $M_{LS}$ with regards to process, voltage and/or temperature (PVT) behavior.

The reference current $I_{ref}$, in particular the replica voltage $V_{rep}$ across the replica device $M_{rep}$, is typically generated based on the target value for the current $I_L$ through the power switch $M_{HS}$, $M_{LS}$. By making use of a (single) replica device $M_{rep}$ of the power switch $M_{HS}$, $M_{LS}$, it may be ensured that the reference current $I_{ref}$ is adjusted in accordance with the PVT dependency of the voltage drop across the power switch $M_{HS}$, $M_{LS}$, thereby enabling a precise and efficient sensing of the current $I_L$ through the power switch $M_{HS}$, $M_{LS}$.

The current sensing circuit 150 may be configured such that the first current $I_1$ through the first reference resistor $R_{ref1}$ corresponds to the sum of the reference current $I_{ref}$ and the common-mode biasing current $I_{CM}$ which is drawn by the first terminal of the comparator 152. The reference current $I_{ref}$ may be injected to the first sensing branch at an intermediate node between the first reference resistor $R_{ref1}$ and the first terminal of the comparator 152. On the other hand, the second current $I_2$ through the second reference resistor $R_{ref2}$ may correspond to the common-mode biasing current $I_{CM}$ which is drawn by the second terminal of the comparator 152. By doing this, the target value for the current $I_L$ through the power switch $M_{HS}$, $M_{LS}$ may be set in a particularly precise manner.

The offset unit 151 may comprise the replica device $M_{rep}$ and a current source which is configured to generate a replica current $I_{rep}$ through the replica device $M_{rep}$, thereby generating the replica voltage $V_{rep}$ (as the voltage drop across the replica device $M_{rep}$). The replica current $I_{rep}$ typically depends on the target value for the current $I_L$ through the power switch $M_{HS}$, $M_{LS}$. As a result of this, the reference current $I_{ref}$ can be set in a particularly precise manner.

The offset unit 151 may comprise an offset resistor $R_{ref0}$. Furthermore, the offset unit 151 may be configured to generate the reference current $I_{ref}$ based on the replica voltage $V_{rep}$ using the offset resistor $R_{ref0}$. The temperature dependency of the offset resistor $R_{ref0}$ preferably deviates by less than 10% (notably by less than 5% or by less than 2%) from the temperature dependency of the first reference resistor $R_{ref1}$ and/or the second reference resistor $R_{ref2}$, thereby enabling a particularly precise and robust current sensing scheme.

The offset unit 151 may comprise an offset transistor $M_n$ which is arranged in series with the offset resistor $R_{ref0}$. Furthermore, the offset unit 151 may comprise an operational amplifier, notably an OTA, which is configured to set the reference current $I_{ref}$ through the offset transistor $M_n$ in dependence of.

the voltage drop across the offset resistor $R_{ref0}$ which is caused by the reference current $I_{ref}$; and the replica voltage $V_{rep}$ across the replica device $M_{rep}$.

In particular, the operational amplifier may be configured to set the reference current $I_{ref}$ through the offset transistor $M_n$ such that the voltage drop across the offset resistor $R_{ref0}$ deviates from the replica voltage $V_{rep}$ across the replica device $M_{rep}$ by less than 10% (preferably by less than 5% or by less than 2%). As a result of this, the current $I_L$ through the power switch $M_{HS}$, $M_{LS}$ may be sensed in a particularly precise and robust manner.

The offset transistor $M_n$ of the offset unit 151 may be coupled to the first sensing branch via a clamping transistor $M_{clmp}$, to provide the reference current $I_{ref}$ to the first sensing branch. The gate of the replica device $M_{rep}$ may be coupled to an intermediate node between the offset transistor $M_n$ and the clamping transistor $M_{clmp}$. By doing this, a particularly precise current sensing may be achieved.

The current sensing circuit 150 may comprise a second offset unit 151 which is configured to generate a second reference current $I_{ref2}$ on the second sensing branch, such that the second reference current $I_{ref2}$ is proportional to a second replica voltage $V_{rep}$ across a second replica device $M_{rep}$ of the power switch $M_{HS}$, $M_{LS}$. By doing this, bi-directional offsets may be applied in a flexible and precise manner.

Furthermore, a power converter 100 is described, which comprises a power switch $M_{HS}$, $M_{LS}$. The power converter 100 comprises the current sensing circuit 150 described herein, which is configured to sense a current $I_L$ through the power switch $M_{HS}$, $M_{LS}$. Furthermore, the power converter 100 may comprise a control unit which is configured to control the power switch $M_{HS}$, $M_{LS}$ in dependence of the sensed current $I_L$ through the power switch $M_{HS}$, $M_{LS}$.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

The invention claimed is:

1. A current sensing circuit configured to sense a current through a power switch, the current sensing circuit comprising:

a comparator having a first terminal and a second terminal;

a first sensing branch configured to couple a first node of the power switch with the first terminal of the comparator via a first reference resistor; and an offset unit configured to generate a reference current on the first sensing branch, such that the reference current is proportional to a replica voltage across a replica device of the power switch.

2. The current sensing circuit of claim 1, wherein:

the offset unit comprises the replica device and a current source which is configured to generate a replica current through the replica device, thereby generating the replica voltage; and the replica current depends on a target value for the current through the power switch.

3. The current sensing circuit of claim 1, further comprising:

a second sensing branch configured to couple a second node of the power switch with the second terminal of the comparator via a second reference resistor.

4. The current sensing circuit of claim 3, wherein:

the offset unit comprises an offset resistor; and the offset unit is configured to generate the reference current based on the replica voltage using the offset resistor.

5. The current sensing circuit of claim 4, wherein:

the first reference resistor, the second reference resistor and the offset resistor each have a temperature dependency; and the temperature dependency of the first reference resistor, the second reference resistor and the offset resistor deviate by less than 10% from one another.

6. The current sensing circuit of claim 4, wherein the offset unit comprises:

an offset transistor which is arranged in series with the offset resistor; and an operational amplifier which is configured to set the reference current through the offset transistor in dependence of:

a voltage drop across the offset resistor which is caused by the reference current; and the replica voltage across the replica device.

7. The current sensing circuit of claim 6, wherein the operational amplifier is configured to set the reference current through the offset transistor such that the voltage drop across the offset resistor deviates from the replica voltage across the replica device by less than 10%.

8. The current sensing circuit of claim 6, wherein:

the offset transistor is coupled to the first sensing branch via clamping transistor, to provide the reference current to the first sensing branch; and a gate of the replica device is coupled to an intermediate node between the offset transistor and the clamping transistor.

9. The current sensing circuit of claim 1, wherein the current sensing circuit is configured such that a first current through the first reference resistor corresponds to a sum of the reference current and a common-mode biasing current which is drawn by the first terminal of the comparator.

10. The current sensing circuit of claim 3, wherein the comparator is configured to draw symmetrical and/or identical common-mode biasing currents on the first sensing branch and on the second sensing branch.

11. The current sensing circuit of claim 1, wherein the replica device is a replica of the power switch with regards to process, voltage and/or temperature behavior.

12. The current sensing circuit of claim 1, wherein the reference current is injected to the first sensing branch at an intermediate node between the first reference resistor and the first terminal of the comparator.

13. The current sensing circuit of claim 3, wherein the current sensing circuit comprises a second offset unit configured to generate a second reference current on the second sensing branch, such that the second reference current is proportional to a second replica voltage across a second replica device of the power switch.

14. A power converter comprising:

the power switch;

the current sensing circuit according to claim 1, configured to sense a current through the power switch; and a control unit configured to control the power switch in dependence of the sensed current through the power switch.

15. A method for sensing a current through a power switch, the method comprising:

coupling a first node of the power switch with a first terminal of a comparator via a first sensing branch with a first reference resistor;

coupling a second node of the power switch with a second terminal of the comparator via a second sensing branch with a second reference resistor; and generating a reference current on the first sensing branch, such that the reference current is proportional to a replica voltage across a replica device of the power switch.

16. The method of claim 15, wherein:

generating the reference current comprises generating a replica current through the replica device, thereby generating the replica voltage; and the replica current depends on a target value for the current through the power switch.

17. The method of claim 15, wherein:

generating the reference current comprises generating the reference current based on the replica voltage using an offset resistor.

18. The method of claim 17, wherein:

the first reference resistor, the second reference resistor and the offset resistor each have a temperature dependency; and the temperature dependency of the first reference resistor, the second reference resistor and the offset resistor deviate by less than 10% from one another.

19. The method of claim 17, wherein generating the reference current comprises:

setting the reference current through an offset transistor which is arranged in series with the offset resistor in dependence of:

a voltage drop across the offset resistor which is caused by the reference current; and the replica voltage across the replica device.

20. The method of claim 19, wherein the reference current through the offset transistor is set such that the voltage drop across the offset resistor deviates from the replica voltage across the replica device by less than 10%.

* * * * *